United States Patent [19]
Jin et al.

[11] Patent Number: 5,792,522
[45] Date of Patent: Aug. 11, 1998

[54] HIGH DENSITY PLASMA PHYSICAL VAPOR DEPOSITION

[75] Inventors: Shu Jin, Sunnyvale; Xiao Chun Mu, Saratoga, both of Calif.; Xing Chen, Cambridge; Lawrence Bourget, Reading, both of Mass.

[73] Assignee: Intel Corporation, Santa Clara, Calif.

[21] Appl. No.: 715,109

[22] Filed: Sep. 18, 1996

[51] Int. Cl.$^6$ .................................... H05H 1/30
[52] U.S. Cl. .................. 427/575; 427/58; 427/124; 427/125; 427/126.1; 427/256; 427/294; 427/571; 427/576
[58] Field of Search .................. 427/571, 575, 427/576, 58, 124, 125, 126.1, 256, 294

[56] References Cited

U.S. PATENT DOCUMENTS

5,178,739  1/1993  Barnes et al. .................. 204/192.12
5,453,305  9/1995  Lee .................................. 427/571

*Primary Examiner*—Bernard Pianalto
*Attorney, Agent, or Firm*—Blakely, Sokoloff, Taylor & Zafman

[57] ABSTRACT

A method for forming a material in an opening on a substrate, such as a wafer, using an electron cyclotron resonance-assisted high density plasma physical vapor deposition system. The method comprises the steps of: maintaining a pressure in the range of approximately 1 mTorr to approximately 6 mTorr; generating a plasma by providing a microwave power in the range of approximately 3 kilowatts (kW) to approximately 5 kW; applying a direct current (DC) voltage to a target source of the material in the range of approximately (negative) −600 volts to approximately −1000 volts; providing a current of a predetermined amount to a first electromagnet; and providing a current to a second electromagnet that is less than said predetermined amount, wherein said second electromagnet is disposed below said first electromagnet; and forming a layer of the material in the opening.

29 Claims, 5 Drawing Sheets

HIGH DENSITY PLASMA PHYSICAL VAPOR DEPOSITION

BACKGROUND OF THE INVENTION

1. Field of the Invention

The field of our invention relates generally to semiconductor manufacturing, and more particularly to a method for modulating the filling characteristics of a high-aspect ratio opening in a substrate (e.g., a wafer) by controlling the process parameters of pressure, target voltage, microwave power and the substrate potential of an electron cyclotron resonance-assisted high density plasma physical vapor deposition system.

2. Description of Related Art

During the process of semiconductor fabrication, alternating layers of a nonconducting material (dielectric), such as silicon dioxide, and of a conductor, such as aluminum (Al), are formed over the semiconductor substrate. Devices, such as transistors or diodes, among others, are formed at and within the semiconductor substrate. In order to make contact between the lowest layer of conductive material and a region of a device, at and within the semiconductor substrate, such as a source or a drain, an opening through a first dielectric layer is made to form a contact. An opening is often formed in the dielectric layer between two conductive layers in order to form a via that connects one conductive layer to another. The term "via" will be used in this application to refer to both a "contact" and a "via".

Electrically active regions of a semiconductor substrate need to be connected or "wired" together in order for an electronic device to function. This is accomplished by depositing a conductive material in an opening between two conductive layers that are separated by a dielectric. The conductive material is often referred to as an interconnect.

Physical vapor deposition (PVD) is often used to deposit a material, such as aluminum, into an opening in a semiconductor substrate to form an interconnect. Sputtering is a process used in PVD to deposit a desired material on the substrate. Conventional PVD utilizes a vacuum chamber where a (solid piece) target of the desired material is located. A stage for holding a substrate (e.g., a wafer) is also located in the chamber below the target at a predetermined distance. In addition, there is a gas inlet for flowing gas into the chamber and a source of electrical power for the chamber as well as the target.

The following steps occur during PVD. One places a wafer onto the stage and the pressure in the chamber is reduced by pumps (pumped down) to a minimum vacuum (e.g., $1 \times 10^{-9}$ torr range). An inert gas, such as argon, is introduced into the chamber and the resulting pressure is allowed to stabilize to a predetermined value. Power is then provided to the sources of electrical power which create an electric field. The argon gas molecules ionize when exposed to the electric field. The positively charged argon atoms are attracted to the target (which is negatively charged) and accelerate toward it. During the acceleration, the charged argon atoms gain momentum, which is a force, and strike the target. The momentum transfer resulting from the argon ions striking the target causes the target's atoms to sputter off the target, and scatter in a direction generally towards the substrate. The sputtered target material, the argon ions, gas atoms and electrons generated by the sputtering process form a plasma region in front of the target.

The limitations of conventional PVD are illustrated as the industry trend is toward smaller device dimensions in order to allow for a greater density of devices per die and thus, per wafer. As the device dimensions shrink, the width of the openings for various trenches, vias and lines that comprise the structure of a device, also shrinks. The thickness of the dielectric layer and metal layer is also shrinking, but at a slower rate than the diameter and width of the vias, trenches and lines. The trend is for the aspect ratio (AR), which is defined as the depth of an opening divided by its width, to increase as device dimensions shrink. Currently, the openings (e.g., a via) are approximately 0.25 microns to 0.6 microns wide and approximately 1.0 to 1.2 microns deep. The narrow dimensions of an electrical interconnect (formed in such a high-aspect ratio opening) lead to a higher resistance in the dielectric and greater current densities in the conductive layer.

Figure 1:
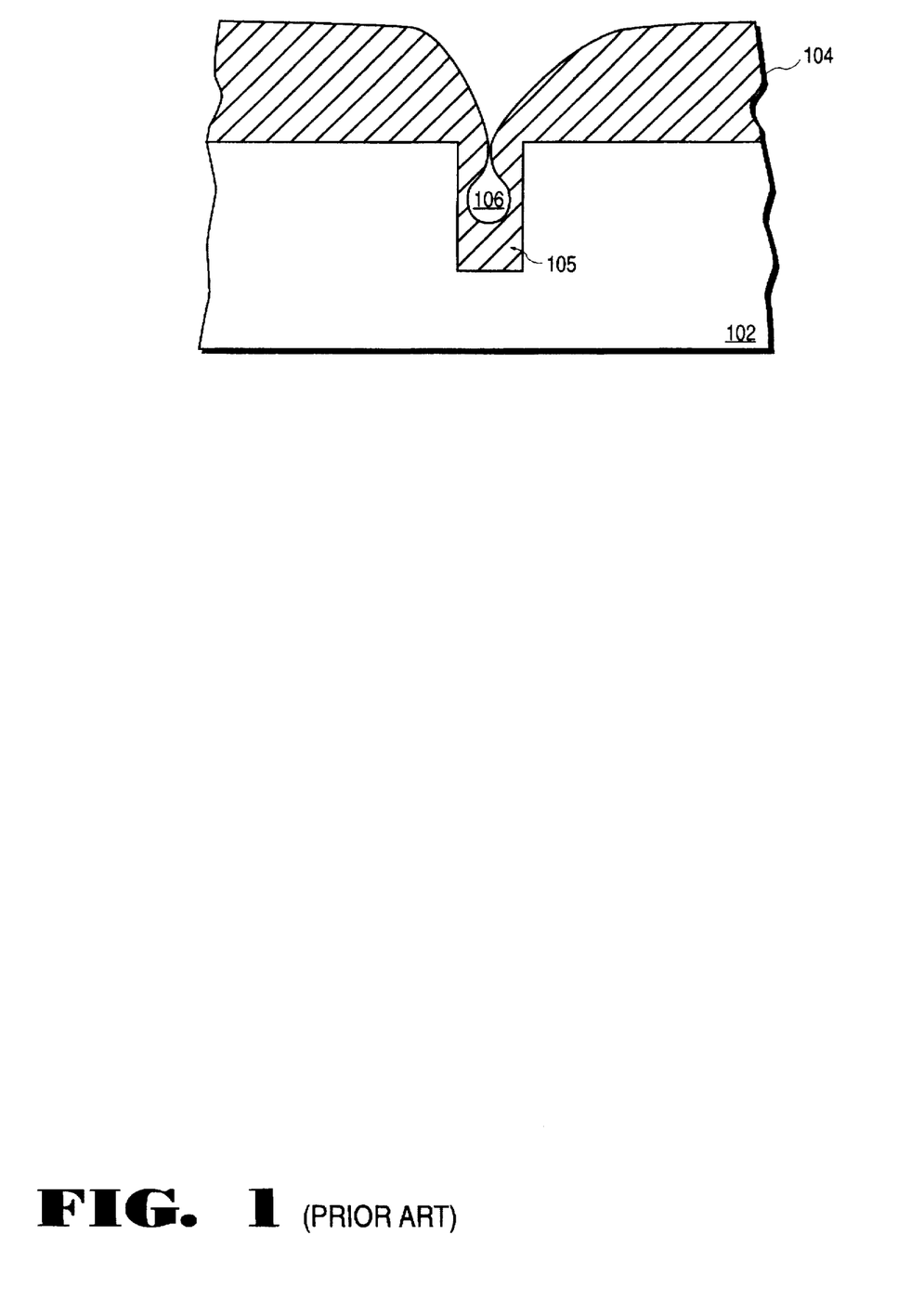
FIG. 1 illustrates a high aspect ratio opening that was partially filled using a prior art method.

High-aspect ratio openings are extremely difficult to fill under conventional PVD methods. One reason is that the sputtered target atoms tend to dislodge in a cosine distribution so that the atoms approach the wafer surface at various angles (or off-axis) as opposed to primarily in the vertical direction. As illustrated in FIG. 1, the result of the angular approach is that sputtered material 104 builds up along the sidewalls of the opening before the opening is filled at the bottom. The sidewall buildup may be so severe as to create incomplete surface coverage and a void 106 in the partially filled hole 105. This condition is known as a pinch-off (or angel wings) because the top of the opening is closed off before complete filling of the opening is achieved. If an opening, such as a via, is not completely filled, then a reliable electrical connection cannot be obtained and the device will not function, or the device will fail prematurely (a device reliability problem).

The concept of using an evaporated metal species (which is formed into a high density plasma) to fill a high-aspect ratio opening in a substrate is being explored. This concept is further described in, e.g., W. M. Holber, et al., *J Vac. Sci. Technol.*, A Vol. 11, No. 6, 2903 (1993). To date, no one has implemented a commercially viable process using an evaporated metal species as the source of the material deposited in the opening of the substrate.

Another solution to the problem of filling a high-aspect ratio opening is to use a sputter reflow process. In sputter reflow, the substrate is heated (either during sputtering or after sputtering) until the material (e.g., aluminum (Al)) on the wafer begins to reflow (become liquid-like). In other words, when heated to a temperature near the material's melting point, the material softens and "flows" to smooth out its coverage over the topography of the substrate. In addition, the softened material removes voids that had formed on the substrate. If aluminum is used, the sputter reflow process requires that the wafer be heated to a temperature of 400° C. or higher. If copper is used, then a sputter reflow temperature of 500° C. or higher would be required. Although sputter reflow can be effective for removing voids, it is not a viable process for use on a deposited metal layer which is disposed above another metal layer or another high temperature-sensitive material. This is because of the potential of damaging or degrading an underlying metal during a multilevel metallization.

Advanced microprocessor manufacturing and research discovered that interconnects are a major part of device delay because of the resistivity of the metal used and the dielectric constant of the interlayer dielectric used.

Consequently, in its search for lower dielectric constant (lower than 4) materials to reduce device delay, the industry began using polymer type of materials. Unfortunately, these polymers often have poor thermostability. Thus, during sputter reflow, when these polymers are heated to about 400° C. or higher, the polymers tend to evaporate or decompose. In other words, these polymers did not function well at high temperature sputter-reflow processes.

Another problem with using high temperature processes, such as sputter reflow (that occur above 500° C.), is that deposition materials may then diffuse through a barrier layer causing detrimental reactions that can reduce the performance and reliability of a device.

Another method to deal with inadequate filling of an opening due to the various angles of the sputtered material's deposition is to use a collimator. A collimator is a filter that blocks the highly off-axis sputtered atoms from hitting the substrate by landing on the collimator instead. Thus, the sputtered atoms that have a primarily vertical direction will be deposited in the opening of the substrate. One problem with the collimator is that one must physically insert the collimator into the process chamber which increases contamination concerns. Another problem is that with use, the collimator becomes ineffective due to the buildup of sputtered material on the collimator and needs to be replaced. Thus, collimators are not an effective solution to achieve more directional sputtering of a target species (e.g., Aluminum ions) into a high aspect ratio opening.

It would be advantageous to have a low temperature process for filling high-aspect ratio openings.

It would also be desirable to have a commercially feasible method of filling high-aspect ratio openings.

SUMMARY

The present invention is a method for forming a material in an opening on a substrate. The method comprises the steps of: providing a vacuum chamber; placing a substrate on a stage located within the vacuum chamber; flowing a gas into the vacuum chamber to ignite a high-density plasma by applying an electromagnetic field to the vacuum chamber; and maintaining a pressure within the vacuum chamber at approximately 1 mTorr to about 6 mTorr.

BRIEF DESCRIPTION OF THE DRAWINGS

The present invention is illustrated by way of example and not by limitation in the Figures of the accompanying drawings in which like references indicate similar elements.

DETAILED DESCRIPTION

A method is described for depositing a material in an opening on a substrate, such as a semiconductor substrate, using an electron cyclotron resonance-assisted high density plasma physical vapor deposition system (ECR-HDPPVD). In the following description, numerous specific details are given to provide a thorough understanding of the invention, such as the formation of angel wings or the use of aluminum as a target source of material. However, it will still be apparent to one skilled in the art that the invention may be practiced without these specific details. Moreover, in some instances, well-known semiconductor equipment and processes have not been set forth in detail in order not to unnecessarily obscure the invention.

One aspect of the present invention is to sputter atoms off a metal target (e.g., Al) so that an increasing number of metal atoms will conform or fill an opening in a substrate (e.g., electronic device). As the sputtered metal species pass through a high density plasma (e.g., $10^{12} cm^{-3}$) generated by an electron cyclotron resonance system, the sputtered metal species will become ionized. As a result, most of the sputtered metal species achieve a more perpendicular direction with respect to the substrate (which is located below the target) so that more of the metal species is deposited or formed in the opening (e.g., a via).

Figure 2:
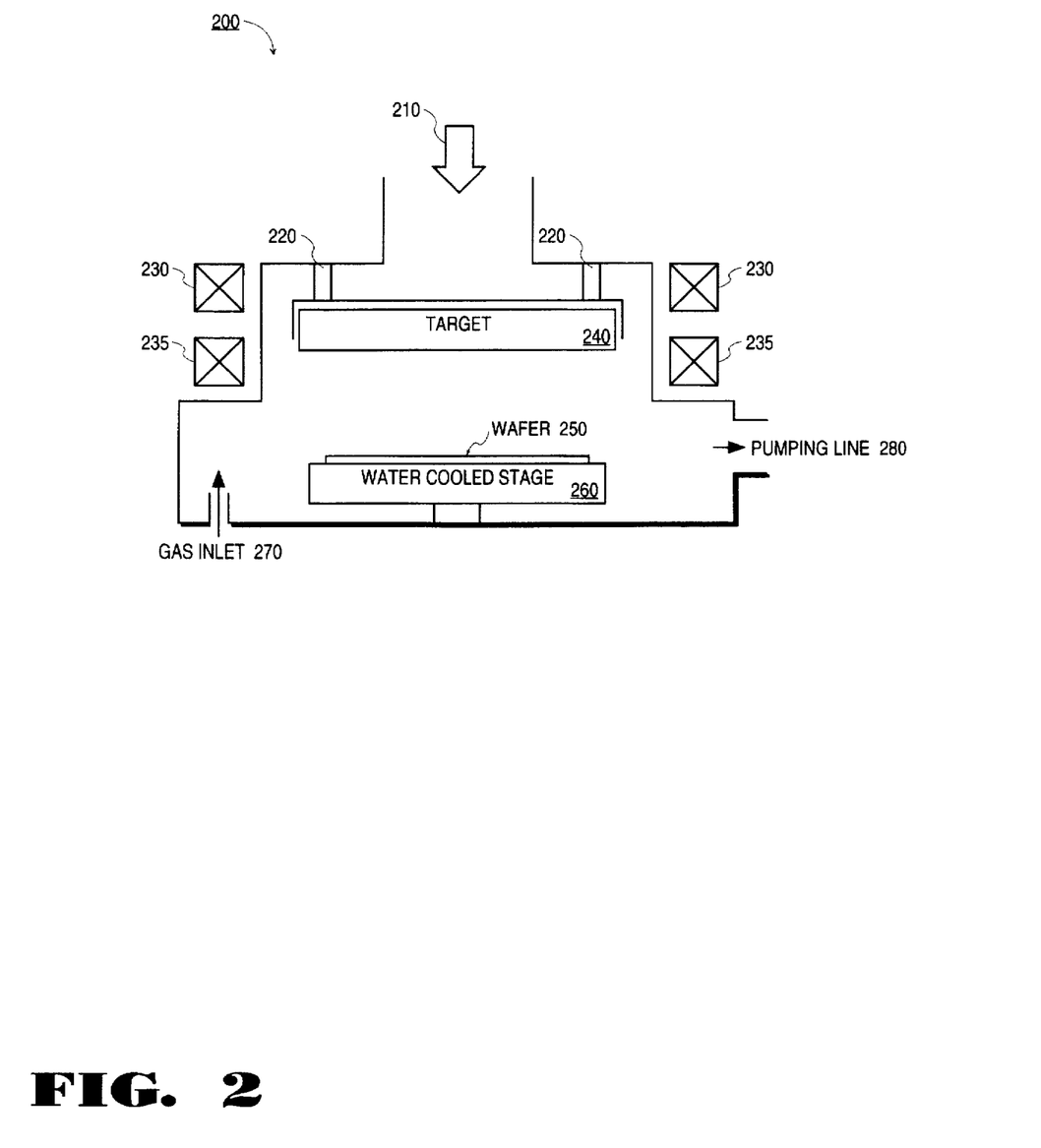
FIG. 2 illustrates a cross-section of part of the hardware used with the claimed process. The hardware is not part of the present invention.

FIG. 2 shows the experimental apparatus, an ECR-HDPPVD 200 which is used to illustrate the present inventive process. The ECR-HDPPVD 200 is manufactured and supplied by Applied Science and Technology, Inc. (ASTeX) which is located at 35 Cabot Road, Woburn, Mass. 01801.

Referring still to FIG. 2, some of the basic components of the experimental apparatus, ECR-HDPPVD 200, is described to provide a context for the claimed process. The microwave power 210 is provided by a source above a target (e.g., Al or Cu) 240. An annular quartz window 240 is above the target 240 which is located in a vacuum chamber. Target 240 supplies the sputtered species (or material) that fills the opening. In one embodiment, the target is surrounded by a first electromagnet 230 and a second electromagnet 235 which together create a magnetic field upon receiving a current. The range of the current provided to both electromagnets (230, 235) is approximately one-hundred to two-hundred and thirty amperes. In this particular embodiment, the current provided to the first electromagnet is typically greater than the amount provided to the second electromagnet 235 which is disposed below the first electromagnet. In another embodiment, a current of two-hundred and thirty amps is applied to first electromagnet 230 while a current of one-hundred and eighty amps is applied to second electromagnet 235. It is to be appreciated that the amount of current provided to the electromagnets (230, 235) will vary depending on the size, shape and configuration of the electromagnets.

The substrate (e.g., wafer) 250 is disposed below the target 240 and is pasted onto a copper, water-cooled stage 260 in one embodiment. The paste enhances thermal conductivity between the back side of the wafer and the stage. The stage is at approximately room temperature.. In addition, there is a gas inlet line 270 for flowing an inert gas (e.g., argon) into the vacuum chamber and a pumping line 280 for reducing the pressure in the vacuum chamber. A more detailed description of the experimental apparatus may be found in U.S. patent application Ser. No. 08/521,958.

Figure 3:
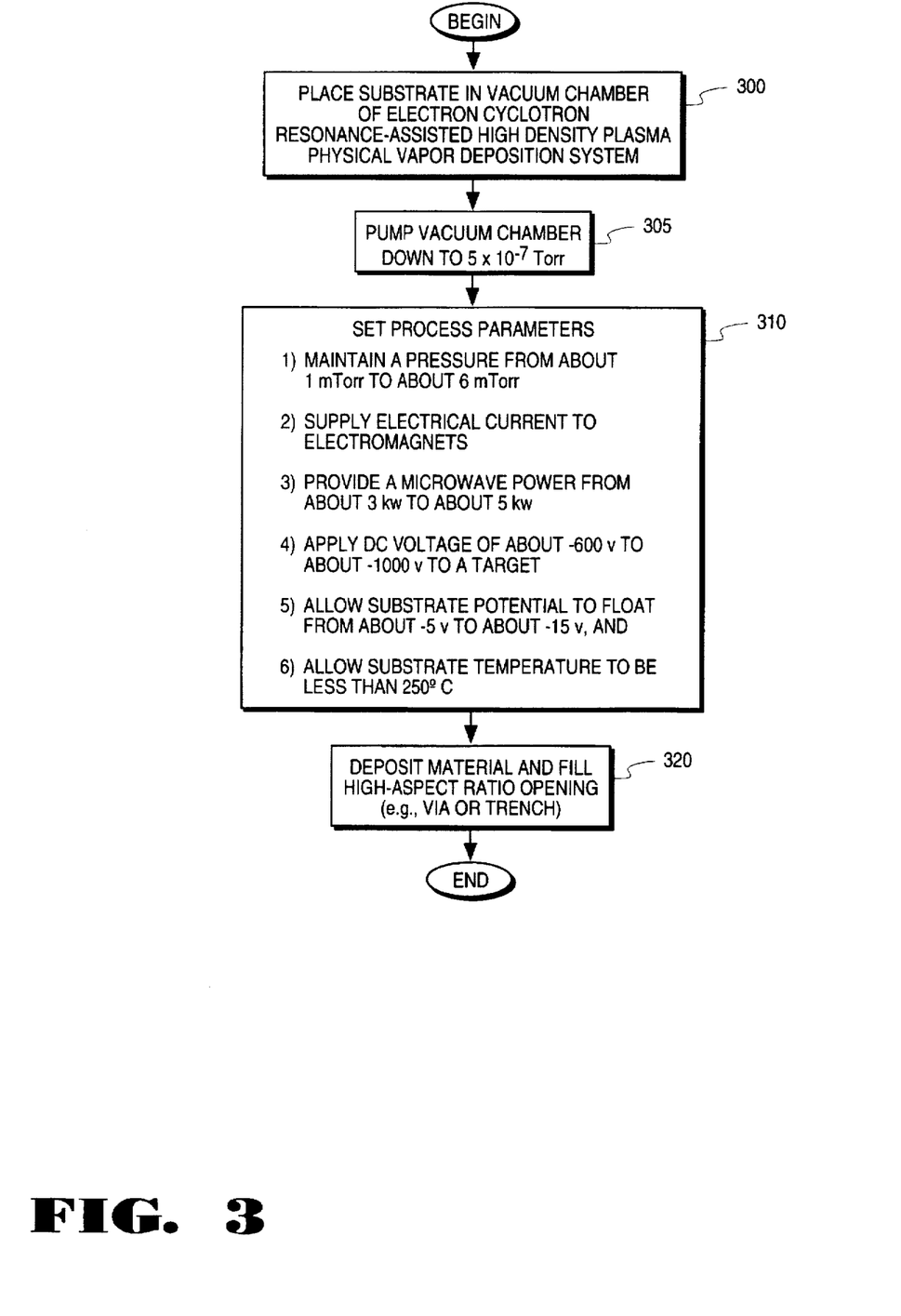
FIG. 3 is a flow chart that illustrates a method of the present invention.

FIG. 3 is a flow chart that illustrates a method of the present invention. In step 300, the substrate is placed in a vacuum chamber of the electron cyclotron resonance-assisted high density plasma physical vapor deposition system described in FIG. 2. The vacuum chamber is pumped down using pumping line 280 until the pressure is approximately $5 \times 10^{-7}$ Torr. Next, step 310 illustrates setting the process parameters under one embodiment of the present invention. The first step is maintaining a pressure from about 1 mTorr to about 6 mTorr after pumping an inert gas, such as argon into the vacuum chamber, supplying a current to electromagnets (230, 235) to create a magnetic field, providing a microwave power of about 3 kilowatts (kW) to about 5 kW and with a frequency of about 2.45 gigaHertz (GHz), and applying a direct current (DC) voltage from about (negative) −600 volts (v) to about −1000v to a target. During this process, the argon gas molecules become positively ionized ($Ar^+$) when exposed to the electric field. In addition, the negatively charged target also ejects electrons which accelerate toward the high density plasma. Along the way, some of these electrons collide with the argon gas atoms, causing the gas atoms to become ionized. The positively ionized argon atoms then accelerate to the target (e.g., Al or Cu), initiating the sputtering process. Some of the target material is sputtered (removed) from the target and is deposited into the opening in the substrate.

The substrate potential is allowed to float from approximately −5 volts to about −15 volts. When the substrate is floated, no power source is connected to the substrate, and the substrate is not connected to ground. The process of floating the substrate potential occurs as follows. Because the electrons in the plasma are lighter than the positively charged ions, the electrons reach the substrate faster than the positively charged ions. Thus, there is a greater electron flux than ion flux toward the substrate. As a result, a self-induced negative (with respect to the plasma) potential is created at the substrate. Once equilibrium is obtained at the substrate, it will be difficult for additional electrons to land on the substrate because they will be repelled by the self-induced negative potential of the substrate. It is to be noted that similar filling performance is obtained when the substrate is electrically grounded. Thus, the substrate may be connected to ground or floated.

In addition, the substrate temperature is less than about 250 degrees Celsius (°C.). The low temperature of the substrate lowers the stress and also allows a wide range of low dielectric constant materials, such as polymers, to be used. Finally in step 320, sputtered material from the target, such as aluminum, is deposited, which will fill a high-aspect ratio (AR) opening, such as a via or a trench with an AR of 2:1. Under optimum process conditions, the present invention achieves a deposition rate of about 960–3500 angstroms (Å) per minute.

Under one embodiment of the present invention, aluminum (Al) is deposited in a high-aspect ratio opening of a semiconductor substrate. It is to be appreciated that other metals, such as copper (Cu), silver (Ag), tantalum (Ta) and titanium (Ti) may also be formed in the substrate opening instead of aluminum (Al) in the present invention. Other compounds may also be used, for example, titanium nitride (TiN) with the addition of nitrogen gas. The opening may have a 2:1 AR with a width of about 0.4–1.0 micron for a trench/via or a width of about 0.35–1.0 micron for a line and a depth of about 1.0–1.2 microns for either type of opening. According to one embodiment, the process parameters are maintaining a pressure of 3 mTorr, providing an electrical current of approximately 230 amperes to a first electromagnet, and providing a current of about 180 amperes to a second electromagnet placed below the first electromagnet. Finally, a microwave power of 5 kW is provided to generate a plasma, a DC voltage of approximately −800 volts is applied to a target (e.g., Al) and a substrate potential is floated at about −10 volts. The substrate may also be electrically grounded in another embodiment.

Under one embodiment, a cylindrical shaped plate target of aluminum with a 5 inch diameter and a six inch wafer are used. It is to be appreciated that the process parameters must be scaled accordingly if a larger wafer, a target of a different size or shape, or a different target source is used.

The method of the present invention provides the optimal ranges for the process parameters of pressure, target voltage and microwave power of an ER-HDPPVD system in order to increase filling performance for a high AR opening. This is accomplished by increasing the ionization ratio (i.e., the number of ions relative to the number of neutrals (uncharged species) in the plasma). Although the ionization ratio may not be directly measured, other parameters may be measured which give a fairly accurate estimate of the ionization ratio, such as the use of optical emission spectroscopy to detect the presence of (aluminum) Al ions versus neutral Al species. This is because charged and uncharged species have different wavelengths which are detected by an optical emission spectroscopy. Thus, the relative amounts of ionized species versus uncharged species may be quantified.

An increased ionization ratio naturally implies a more directional deposition because a higher ionization ratio means that there are more ions than neutrals in the plasma. Ions or ionized species of the sputtered target material will accelerate faster towards the negatively biased substrate than an uncharged atom of the target. The positively charged ions are redirected to a direction that is perpendicular to the negatively biased substrate due to the plasma potential (which is positive relative to the substrate). This results in less off-axis (non-vertical) scattering of the target material, and more of the sputtered target material is deposited in the opening of the substrate.

Figure 4A:
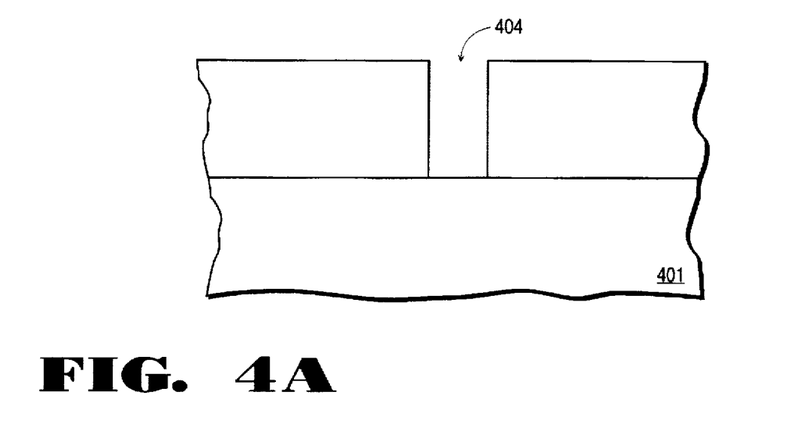
FIG. 4A illustrates a high-aspect ratio opening.
Figure 4B:
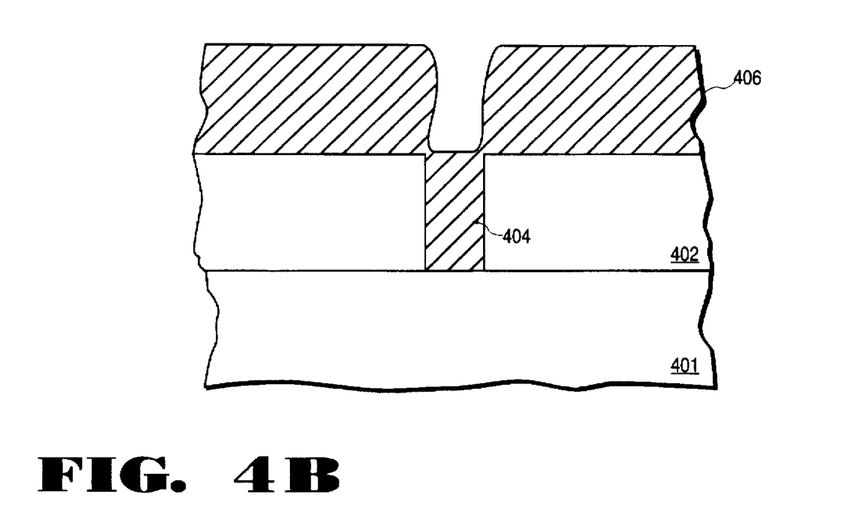
FIG. 4B illustrates a high-aspect ratio opening that was filled by using a method of the present invention.

FIGS. 4A and 4B illustrate how an opening 404 is filled when that opening 404 is in a region of a substrate 401 to which contact will be made. The opening 404 is surrounded by a dielectric 402. A layer of aluminum 406 is deposited using the present invention as described above so that an even deposition of aluminum 406 fills the opening 404 and along the top of the opening without forming any voids or angel wings. This is a significant improvement because such directional deposition and filling of a high AR opening could not be achieved under prior art methods, since a pinch-off or a void would tend to form.

Figure 5:
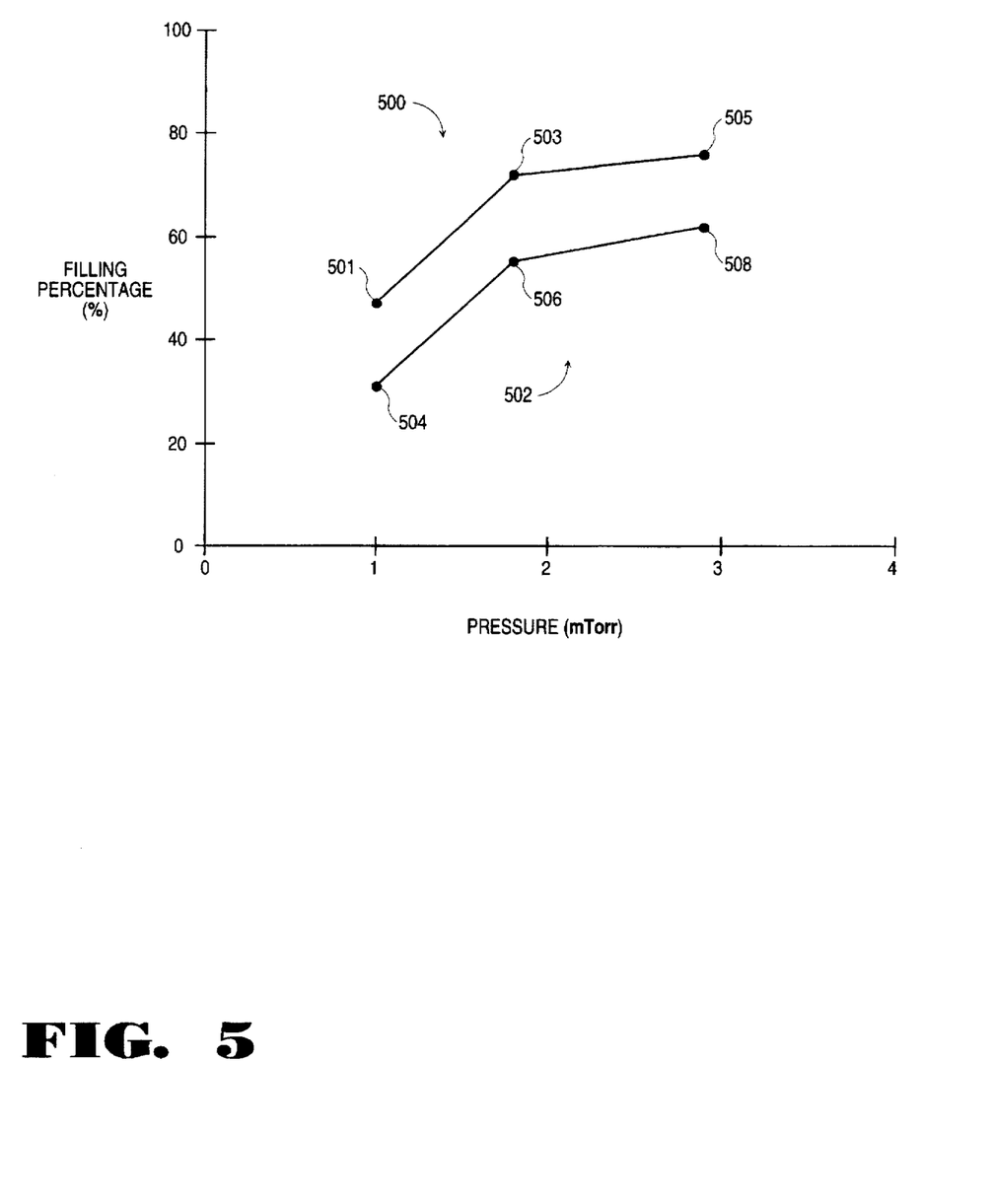
FIG. 5 illustrates how pressure modulates the filling characteristics under a method of the present invention.

FIG. 5 illustrates how the filling percentage changes as a function of process pressure (which was measured in the vicinity of the wafer). The filling percentage is measured as the average film thickness inside an opening (e.g., via) divided by the height of the opening. When the pressure is increased, there are more interactions between the sputtered (target) species and the electrons which cause the ionization of the species. Within the investigated pressure range of 1 milliTorr ("mTorr" or "mT")–5 mTorr (measured on the x-axis), the filling percentage (measured on the y-axis) of the opening (e.g., trench) is optimized at a process pressure of approximately 3 mTorr as seen in curve 500 and curve 502. For both curves 500 and 502, the following process parameters were maintained at these values: 5 kW microwave power, a target voltage of −0.8 kV was applied to the target and the stage potential was allowed to float. In addition, a current of 230 amperes (amps) was provided to a first electromagnet (e.g., 230 of FIG. 2) and a current of 180 amps was provided to a second electromagnet (e.g., 235 of FIG. 2). The trench to be filled had a height of 1.2 microns. In addition, for curves 500 and 502, the deposition times were varied so that the same film thickness (e.g., 1.2 microns) on the flat surface of the substrate was obtained.

On curves 500 and 502, the pressure was modulated at three different points. The width of the trench was different for each curve. The trench measured in curve 500 had a width of 0.60 micron which is greater than the width of 0.45 micron for the trench of curve 502. Since, the trench of curve 502 is smaller than the trench of curve 500, the trench (and thus, curve 502) fills (rises) more slowly than the other trench (curve 500).

Referring still to FIG. 5, below a pressure of 3 mTorr, when the other process parameters of microwave power, target voltage and substrate potential remain constant, a pinch-off may form before optimum filling of the opening is obtained. For example, on curve 500, a filling percentage ("fill %") of 47% is obtained with a pressure of 1.0 mT at point 501, increasing to 72% at 1.6 mT at point 503, and finally reaching 76% at 2.9 mT at point 505. A similar pattern is seen at point 504 of curve 502 when a fill % of 31% is obtained with a pressure of 1.0 mT, then at point 506 when the fill % is 55%, and a final fill % of 62% is achieved with a pressure of 2.9 mT at point 508. Thus, the pressure modulates filling performance when the pressure is changed while the other process parameters (e.g., voltage to target) remained static. It is to be noted that other process parameters (e.g., microwave power) may also affect filling performance if it alone was varied while the remaining parameters are not changed.

It is to be appreciated that the method of the present invention may also be used to form a high-step coverage adhesion or glue layer for contacts and a conformal wetting layer for interconnects to lower the planarization temperature.

In the above description, numerous specific details were given to be illustrative and not limiting of the present invention. It will be apparent to one skilled in the art that the invention may be practiced without these specific details. Furthermore, specific semiconductor manufacturing equipment and processes have not been set forth in detail in order not to unnecessarily obscure the present invention. Thus, the method of the present invention is defined by the appended claims.

Thus, a method is described for forming a material in a high-aspect ratio opening on a semiconductor substrate by increasing the ionization of the plasma in an ECR-HDPPVD system.

We claim:

1. A method of depositing material in an opening formed in a substrate, comprising the steps of:
   a) providing a vacuum chamber having a target located therein;
   b) placing a substrate on a stage located within the vacuum chamber;
   c) flowing a gas into the vacuum chamber to ignite a high-density plasma by applying an electromagnetic field to the vacuum chamber;
   d) maintaining a pressure within the vacuum chamber at between 1 mTorr and 6 mTorr; and
   e) applying a voltage to said target of between −600 V and −1000 V.

2. The method of claim 1, wherein said substrate is at floating potential.

3. The method of claim 1, wherein said substrate is electrically grounded.

4. A method of depositing material in an opening formed in a substrate, comprising the steps of:
   a) maintaining a pressure in a chamber of an electron cyclotron resonance-assisted high density plasma physical vapor deposition system at between 1 mTorr and 6 mTorr;
   b) generating a plasma by providing microwave power of between 3 kW and 5 kW; and
   c) applying a voltage to a target, being a source of deposition material, in the range of between −600 V and −1000 V.

5. The method of claim 4, wherein said ECR system further includes a first electromagnet disposed above a second electromagnet, and wherein said method further includes the steps of:
   providing an electrical current of a predetermined amount to said first electromagnet; and
   providing an electrical current to said second electromagnet that is less than said predetermined amount provided to said first electromagnet.

6. The method of claim 4, wherein said substrate is connected to ground.

7. The method of claim 4, wherein a substrate potential is floating.

8. The method of claim 4, wherein said material is a conductor.

9. The method of claim 8, wherein said conductor is aluminum.

10. The method of claim 8, wherein said conductor is copper.

11. The method of claim 4, wherein said substrate temperature is within a range that is controlled to be less than 250° C.

12. The method of claim 4, wherein said opening has a depth to width ratio of at least 2:1, wherein the width is approximately 0.35 micron to 1.0 micron and the depth is approximately 1.2 microns.

13. The method of claim 4, wherein the material in an opening occurs is deposited to a thickness of between 950 Å and 3500 Å.

14. A method of depositing material in a high-aspect ratio opening on a substrate using an electron cyclotron resonance-assisted high density plasma physical vapor deposition ("ECR") system having an annular window disposed above a target of the material, said method comprising the steps of:
   a) maintaining a pressure in a chamber of said ECR system of between 1 mTorr and 6 mTorr;
   b) providing microwave power of between 3 kW and 5 kW to said chamber; and
   c) applying a voltage to said target of between −600 V and −1000 V.

15. The method of claim 14, further comprising the steps of:
   a) providing an electrical current of a predetermined amount to a first electromagnet; and
   b) providing an electric current to said second electromagnet that is less than said predetermined amount provided to said first electromagnet.

16. The method as in claim 15, wherein said substrate is grounded.

17. The method as in claim 15, wherein said substrate potential is floating.

18. The method as in claim 15, wherein the temperature range for said substrate is less than approximately 250° C.

19. A method of forming a material from a target in an opening on a wafer disposed within a vacuum chamber, comprising the steps of:
   a) maintaining a pressure in the vacuum chamber in the range of between 1 mTorr and 6 mTorr;
   b) providing a current to a first electromagnet;

c) providing a current to a second electromagnet; and d) maintaining the wafer at a temperature of less than 250° C.

20. The method of claim 19, wherein the wafer is electrically grounded.

21. The method of claim 19, wherein the wafer has a floating potential.

22. The method of claim 19, further including the step of:

providing a microwave power in the range of between 3 kW and 5 kW.

23. The method of claim 22, further comprising the step of:

applying a voltage of between −600 V and −1000 V to said target.

24. A method for depositing a material from a target into a high aspect ratio opening of a substrate by using an electron cyclotron resonance-assisted high density plasma physical vapor deposition system having an annular quartz window disposed above said target which is located in a vacuum chamber, said method comprising the following steps:

a) maintaining a pressure of approximately 3 mTorr in the vacuum chamber;

b) providing a microwave power of approximately 5 kW to generate a high density plasma; and c) applying a voltage of approximately −800 volts to said target.

25. The method of claim 24, further comprising the following steps:

a) providing a current of a predetermined amount to a first electromagnet; and b) providing a current that is less than or equal to said predetermined amount to a second electromagnet that is disposed below said first electromagnet, wherein said first electromagnet and said second electromagnet surround said target.

26. The method of claim 25, wherein said substrate is connected to ground.

27. The method of claim 25, wherein said substrate's potential is floating.

28. The method as in claim 24 wherein said material is selected from a group consisting of Al, Cu, Ag, Ta, W, Ti and TiN.

29. The method of claim 24, wherein said substrate's temperature is less than 250° C.

* * * * *